US 8,588,281 B2

(12) United States Patent
Oh et al.

(10) Patent No.: US 8,588,281 B2
(45) Date of Patent: Nov. 19, 2013

(54) TRANSCEIVER HAVING EMBEDDED CLOCK INTERFACE AND METHOD OF OPERATING TRANSCEIVER

(75) Inventors: Woon-taek Oh, Seongnam-si (KR); Jae-youl Lee, Yongin-si (KR); Jin-ho Kim, Suwon-si (KR); Tae-jin Kim, Seoul (KR); Ju-hwan Yi, Seoul (KR); Jong-shin Shin, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 334 days.

(21) Appl. No.: 13/021,883

(22) Filed: Feb. 7, 2011

(65) Prior Publication Data
US 2011/0194590 A1 Aug. 11, 2011

(30) Foreign Application Priority Data
Feb. 5, 2010 (KR) ........................ 10-2010-0011194

(51) Int. Cl.
*H04B 1/38* (2006.01)
(52) U.S. Cl.
USPC ........... 375/219; 375/355; 375/360; 375/376; 375/373; 345/213; 345/99; 345/100; 713/500; 327/341; 327/291; 327/244; 327/156; 348/536; 348/569
(58) Field of Classification Search
USPC ......... 375/359, 355, 259, 354, 257, 353, 361; 345/213, 99, 100; 713/500–503; 327/341, 291, 244, 156; 348/536, 569
See application file for complete search history.

(56) References Cited

U.S. PATENT DOCUMENTS

| 4,485,378 | A | * | 11/1984 | Matsui et al. | 345/28 |
| 7,605,610 | B2 | * | 10/2009 | Oh et al. | 326/86 |
| 7,746,971 | B2 | * | 6/2010 | Masui et al. | 375/355 |
| 7,995,693 | B2 | * | 8/2011 | Lee | 375/359 |
| 8,135,104 | B2 | * | 3/2012 | Kim et al. | 375/374 |
| 2003/0118137 | A1 | * | 6/2003 | Skinner | 375/355 |
| 2005/0286643 | A1 | * | 12/2005 | Ozawa et al. | 375/242 |
| 2007/0057835 | A1 | * | 3/2007 | Jarman et al. | 341/155 |
| 2007/0171161 | A1 | * | 7/2007 | Lin | 345/87 |
| 2008/0158424 | A1 | * | 7/2008 | Park et al. | 348/571 |
| 2008/0168338 | A1 | * | 7/2008 | Lee et al. | 714/800 |
| 2008/0170643 | A1 | * | 7/2008 | Lee | 375/340 |
| 2009/0015537 | A1 | * | 1/2009 | Park et al. | 345/99 |
| 2009/0051675 | A1 | * | 2/2009 | Huang | 345/204 |
| 2009/0167750 | A1 | * | 7/2009 | Hong et al. | 345/213 |
| 2011/0194590 | A1 | * | 8/2011 | Oh et al. | 375/219 |

FOREIGN PATENT DOCUMENTS

| JP | 2009048154 A | 3/2009 |
| KR | 1020090006411 A | 1/2009 |
| KR | 1020090073473 A | 7/2009 |

* cited by examiner

*Primary Examiner* — Daniel Washburn
*Assistant Examiner* — Amneet Singh
(74) *Attorney, Agent, or Firm* — Volentine & Whitt, PLLC

(57) ABSTRACT

A transceiver comprises a transmitter that converts a plurality of data components into serial data in response to a first clock signal and transmits the serial data, and a receiver that receives the serial data and converts the serial data into the plurality of data components in response to a second clock signal generated from the serial data. The transmitter adds at least one dummy bit to the serial data at predetermined intervals. The at least one dummy bit includes information regarding a data type of the plurality of data components.

18 Claims, 18 Drawing Sheets

TRANSCEIVER HAVING EMBEDDED CLOCK INTERFACE AND METHOD OF OPERATING TRANSCEIVER

CROSS-REFERENCE TO RELATED APPLICATIONS

This application claims priority under 35 U.S.C. §119 to Korean Patent Application No. 10-2010-0011194 filed on Feb. 5, 2010, the disclosure of which is hereby incorporated by reference in its entirety.

BACKGROUND

Embodiments of the inventive concept relate generally to transceivers. More particularly, embodiments of the inventive concept relate to transceivers configured to transmit and receive data using an embedded clock signal, and methods of operating the transceivers.

Transceiver devices often transmit and receive data in synchronization with a clock signal. In some transceiver devices, the data and the clock signal are carried on separate lines. However, in some transceiver devices, the clock signal is embedded in the data. A transceiver that transmits and receives data with an embedded clock signal is considered to have an embedded clock interface.

SUMMARY

Embodiments of the inventive concept provide transceivers using embedded clock interfaces, and methods of operating the transceivers.

According to one embodiment of the inventive concept, a method of operating a transceiver comprises converting a plurality of data components into serial data in response to a first clock signal, transmitting and receiving the serial data, generating a second clock signal from the serial data, and converting the serial data into the plurality of data components in response to the second clock signal. Converting the plurality of data components into the serial data comprises adding at least one dummy bit to the serial data at predetermined intervals, the at least one dummy bit indicating a type of the plurality of data components.

In certain embodiments, converting the plurality of data components into the serial data comprises setting the at least one dummy bit to a logical state that is the same as or different from a logical state of a bit adjacent to the dummy bit, according to the type of the plurality of data components, and wherein converting the serial data into the plurality of data components comprises identifying the type of the plurality of data components by comparing the logical state of the bit adjacent to the dummy bit to the logical state of the dummy bit.

In certain embodiments, converting the plurality of data components into the serial data comprises generating the serial data by setting logical states of a predetermined number of bits, including the dummy bit, according to the type of the plurality of data components, and wherein converting the serial data into the plurality of data components comprises identifying the type of the plurality of data components by comparing the logical states of the predetermined number of bits to each other.

In certain embodiments, converting the plurality of data components into the serial data comprises, where the plurality of data components include payload information, setting the at least one dummy bit to a different logical state from a bit adjacent to the at least one dummy bit, and further comprises, where the plurality of data components do not include the payload information, setting the at least one dummy bit to the same logical state as the bit adjacent to the dummy bit, and still further comprises, where the plurality of data components do not include the payload information, setting logical states of a predetermined number of bits, including the bit adjacent to the dummy bit, according to the type of the plurality of data components.

In certain embodiments, converting the serial data into the plurality of data components comprises, where a logical state of the dummy bit is different from a logical state of a bit adjacent to the dummy bit, determining that the plurality of data components include payload information, and further comprises, where the logical state of the dummy bit is the same as the logical state of the bit adjacent to the dummy bit, determining that the plurality of data components do not include the payload information, and still further comprises, where the plurality of data components do not include the payload information, determining the type of the plurality of data components by comparing logical states of a predetermined number of bits, including the dummy bit, to each other.

In certain embodiments, the data components are converted to the serial data by sequentially interleaving the plurality of data components on a bit-by-bit basis in response to the first clock signal.

According to another embodiment of the inventive concept, a transceiver configured to transmit and receive data having an embedded clock comprises a transmitter configured to convert a plurality of data components into serial data in response to a first clock signal and to transmit the serial data, and a receiver configured to receive the serial data and to convert the serial data into the plurality of data components in response to a second clock signal generated from the serial data. The transmitter adds at least one dummy bit to the serial data at predetermined intervals, the at least one dummy bit including information regarding a type of the plurality of data components.

In certain embodiments, the transmitter sets the at least one dummy bit to have a same logical state or a different logic state from a bit adjacent to the dummy bit according to the type of the plurality of data components, and wherein the receiver identifies the type of the plurality of data components by comparing the logical state of the bit adjacent to the dummy bit to the logical state of the at least one dummy bit.

In certain embodiments, the transmitter generates the serial data by setting logical states of a predetermined number of bits, including the dummy bit, according to the type of the plurality of data components, and wherein the receiver identifies the type of the plurality of data components by comparing the logical states of the predetermined number of bits to each other.

In certain embodiments, the transmitter sets a logical state of the dummy bit to a same logic state or a different logical state from a bit adjacent to the dummy bit according to whether the plurality of data components include payload information, and wherein the receiver determines that the plurality of data components include payload information according to whether the logical state of the dummy bit is the same or different from the logical state of the bit adjacent to the dummy bit.

In certain embodiments, where the plurality of data components do not include payload information, the transmitter sets the at least one dummy bit to have the same logical state as the bit adjacent to the dummy bit, and sets logical states of a predetermined number of bits, including the bit adjacent to the dummy bit, according to the type of the plurality of data components, and wherein the receiver determines that the plurality of data components do not include the payload information by detecting that the at least one dummy bit has the same logical state as the bit adjacent to the dummy bit.

In certain embodiments, where the plurality of data components include payload information, the transmitter sets the dummy bit with a same logical state as a bit adjacent to the dummy bit, and the receiver determines whether the plurality of data components include the payload information by detecting whether the logical state of the dummy bit is the same as the logical state of the bit adjacent to the dummy bit.

In certain embodiments, where the plurality of data components do not include payload information, the transmitter sets the dummy bit to a logical state that is different from a logical state of a bit adjacent to the dummy bit and sets logical states of a predetermined number of bits, including the bit adjacent to the dummy bit, according to the type of the plurality of data components, and wherein, where the logical state of the dummy bit is different from the logical state of the bit adjacent to the dummy bit, the receiver determines that the plurality of data components do not include the payload information and identifies the type of the plurality of data components by comparing the logical states of the predetermined number of bits to each other.

In certain embodiments, the transmitter comprises a delay locked loop or a phase locked loop for generating the first clock signal based on a reference clock signal, and the receiver comprises a delay locked loop or a phase locked loop for generating the second clock signal based on the serial data.

In certain embodiments, the transmitter converts the plurality of data components into the serial data by sequentially interleaving the plurality of data components on a bit-by-bit basis in response to the first clock signal.

In certain embodiments, the data components comprise display information to be displayed on a display device.

In certain embodiments, the display device comprises a panel comprising a plurality of pixel areas, wherein the transmitter is part of a controller of the display device, and wherein the receiver is part of a source driver that drives source lines of the panel based on the plurality of data components.

According to another embodiment of the inventive concept, a transmitter for transmitting data with embedded clock information comprises a clock signal generator configured to generate a clock signal based on a reference clock signal, and a data converter configured to convert a plurality of data components to serial data in response to the clock signal. The data converter adds at least one dummy bit to the serial data at predetermined intervals, wherein the at least one dummy bit indicates a type of the plurality of data components.

In certain embodiments, the transmitter converts the plurality of data components to the serial data by sequentially interleaving the plurality of data components on a bit-by-bit basis in response to the clock signal.

In certain embodiments, the data components comprise display information to be displayed on a display device.

BRIEF DESCRIPTION OF THE DRAWINGS

The drawings illustrate selected embodiments of the inventive concept. In the drawings, like reference numbers indicate like features.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

Figure 1:
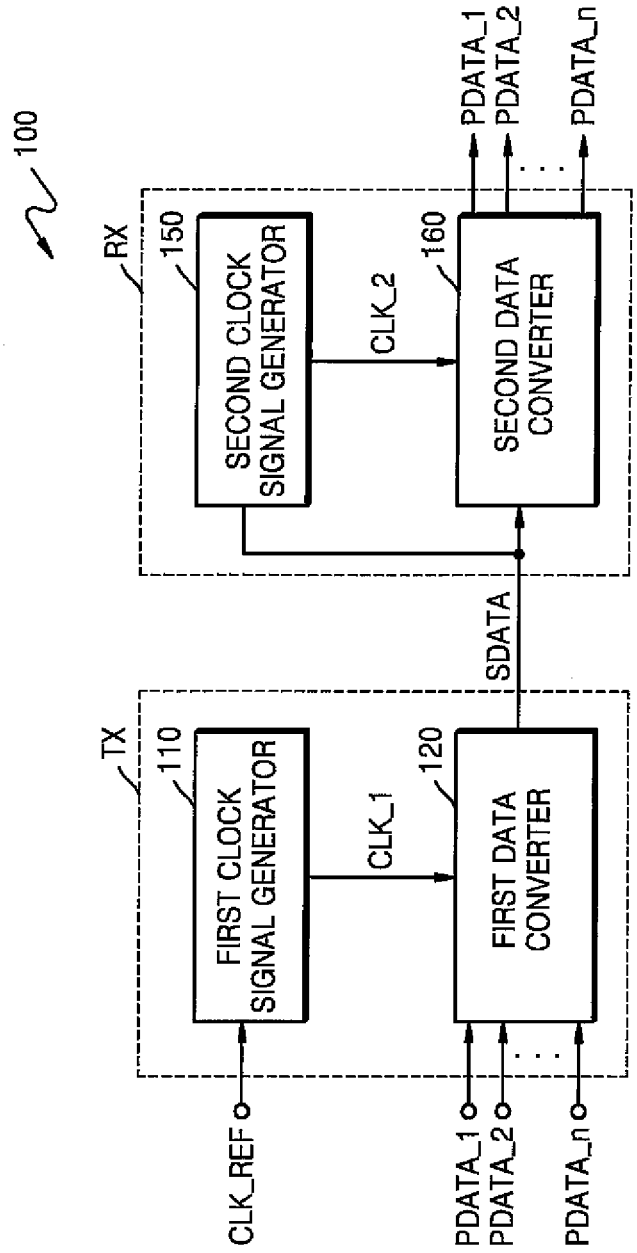
FIG. 1 is a block diagram of a transceiver according to an embodiment of the inventive concept.

FIG. 1 is a block diagram of a transceiver 100 according to an embodiment of the inventive concept.

Referring to FIG. 1, transceiver 100 comprises a transmitter TX and a receiver RX.

Transmitter TX converts a plurality of parallel data components PDATA_1, PDATA_2, ..., PDATA_n into serial data SDATA using a reference clock signal CLK_REF and transmits serial data SDATA to receiver RX. Transmitter TX comprises a first clock signal generator 110 and a first data converter 120. Reference clock signal CLK_REF and data components PDATA_1, PDATA_2, ..., PDATA_n are signals that are generated and output according to the operation of predetermined logic.

First clock signal generator 110 generates and outputs a first clock signal CLK_1 using reference clock signal CLK_REF. First clock signal generator 110 typically comprises a phase locked loop (PLL) or a delay locked loop (DLL). An embodiment of first clock signal generator 110 will be described in further detail with reference to FIG. 2A or 3A.

First data converter 120 converts data components PDATA_1, PDATA_2, ..., PDATA_n into serial data SDATA in response to first clock signal CLK_1. Serial data SDATA comprises information regarding both data components PDATA_1, PDATA_2, ..., PDATA_n and first clock signal CLK_1. An example configuration of first data converter 120 will be described in further detail with reference to FIG. 4. First data converter 120 typically comprises a serializer for converting data components received in parallel into serial data.

First data converter 120 can generate serial data SDATA with at least one dummy bit containing information regarding a type of data components PDATA_1, PDATA_2, ..., PDATA_n. The dummy bit also comprises the clock information. Alternatively, first data converter 120 can convert data components PDATA_1, PDATA_2, ..., PDATA_n into serial data SDATA by sequentially interleaving data components PDATA_1, PDATA_2, ..., PDATA_n on a bit-by-bit basis in response to first clock signal CLK_1. For example, first data converter 120 can generate serial data SDATA in the order of a first bit of first data PDATA_1, a first bit of second data PDATA_2, a first bit of third data PDATA_3, a second bit of first data PDATA_1, a second bit of second data PDATA_2, a second bit of third data PDATA_3. Alternatively, first data converter 120 can generate serial data SDATA by sequentially interleaving data components PDATA_1, PDATA_2, ..., PDATA_n on a bit-by-bit basis in response to first clock signal CLK_1, and inserting at least one dummy bit containing information regarding a type of data components PDATA_1, PDATA_2, ..., PDATA_n. An example of the operation of first data converter 120 will be described in further detail with reference to FIGS. 6 through 12C.

Receiver RX generates a second clock signal CLK_2, using serial data SDATA received from transmitter TX, and converts serial data SDATA to data components PDATA_1, PDATA_2, ..., PDATA_n in response to second clock signal CLK_2. Receiver RX comprises a second clock signal generator 150 and a second data converter 160.

Second clock signal generator 150 generates second clock signal CLK_2 using serial data SDATA. Because serial data SDATA transmitted from transmitter TX comprises information regarding data components PDATA_1, PDATA_2, ..., PDATA_n and the clock information, second clock signal generator 150 generates second clock signal CLK_2 by extracting the clock information from serial data SDATA. Second clock signal generator 150 typically comprises a PLL or a DLL. An example of the configuration of second clock signal generator 150 is described in further detail with reference to FIG. 2B or 3B.

Second data converter 160 converts serial data SDATA to data components PDATA_1, PDATA_2, ..., PDATA_n in response to second clock signal CLK_2. An example of second data converter 160 will be described in further detail with reference to FIG. 5. Second data converter 160 can comprise, for instance, a deserializer for converting data input in serial to a plurality of parallel data components. An example of the operation of second data converter 160 will be described in further detail later with reference to FIGS. 6 through 12C.

Figure 2A:
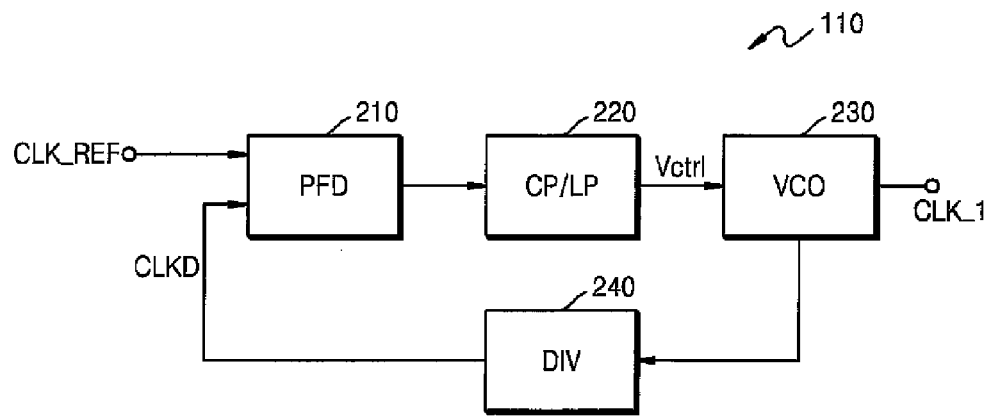
FIG. 2A is a block diagram of a first clock signal generator of FIG. 1 according to an embodiment of the inventive concept.

FIG. 2A is a block diagram of first clock signal generator 110 of FIG. 1 according to an embodiment of the inventive concept. In particular, FIG. 2A illustrates an embodiment where first clock signal generator 110 of FIG. 1 is a PLL.

In the embodiment of FIG. 2A, first clock signal generator 110 comprises a phase frequency detector (PFD) 210, a charge pump/loop filter (CP/LP) 220, a voltage-controlled oscillator (VCO) 230, and a divider (DIV) 240.

PFD 210 detects a phase difference by comparing reference clock signal CLK_REF with a divided clock signal CLKD. CP/LP 220 converts an output signal of PFD 210 to a voltage signal and outputs the voltage signal as a control voltage signal Vctrl for controlling VCO 230. VCO 230 outputs first clock signal CLK_1 with a predetermined frequency in response to control voltage signal Vctrl. DIV 240 outputs divided clock signal CLKD by dividing first clock signal CLK_1 output from VCO 230.

First clock signal generator 110 is not required to have the configuration illustrated in FIG. 2A, and can have another configuration as long as first clock signal CLK_1 is properly generated for normal operation of first data converter 120.

Figure 2B:
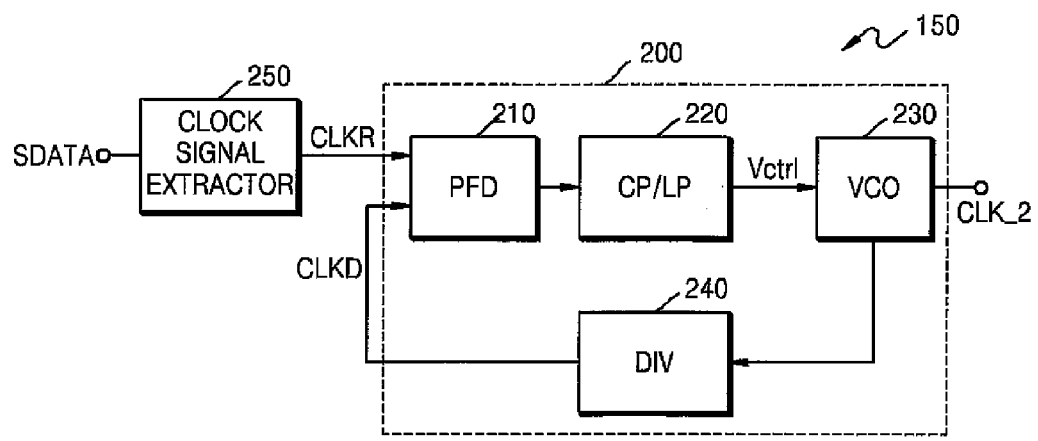
FIG. 2B is a block diagram of a second clock signal generator of FIG. 1 according to an embodiment of the inventive concept.

FIG. 2B is a block diagram of second clock signal generator 150 of FIG. 1 according to an embodiment of the inventive concept. In particular, FIG. 2B illustrates an embodiment where second clock signal generator 150 of FIG. 1 comprises a clock signal extractor 250 and a PLL 200.

Referring to FIGS. 1 and 2B, clock signal extractor 250 extracts a clock signal CLKR from serial data SDATA. Where serial data SDATA comprises a dummy bit containing the clock information, clock signal extractor 250 extracts clock signal CLKR using the dummy bit. Alternatively, where the clock information is not included in the dummy bit but in serial data SDATA, clock signal extractor 250 extracts clock signal CLKR using serial data SDATA.

PLL 200 comprises PFD 210, CP/LP 220, VCO 230, and DIV 240, similar to FIG. 2A.

PFD 210 detects a phase difference by comparing clock signal CLKR with divided clock signal CLKD. CP/LP 220 converts an output signal of PFD 210 to a voltage signal and outputs the voltage signal as control voltage signal Vctrl for controlling VCO 230. VCO 230 outputs second clock signal CLK_2 having a predetermined frequency in response to control voltage signal Vctrl. DIV 240 outputs divided clock signal CLKD by dividing second clock signal CLK_2 output from VCO 230.

Second clock signal generator 150 is not required to have the configuration shown in FIG. 2B, and can have another configuration as long as second clock signal CLK_2 is properly generated for normal operation of second data converter 160.

Figure 3A:
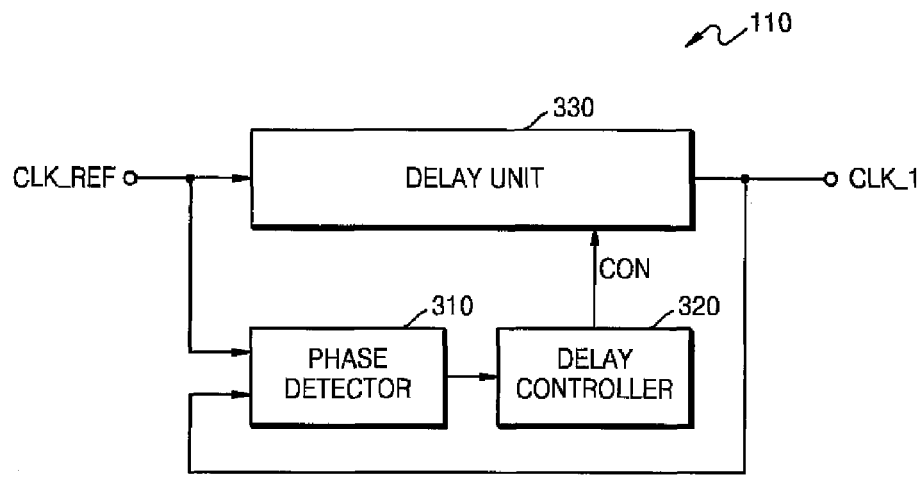
FIG. 3A is a block diagram of the first clock signal generator of FIG. 1 according to another embodiment of the inventive concept.

FIG. 3A is a block diagram of first clock signal generator 110 of FIG. 1 according to another embodiment of the inventive concept. In particular, FIG. 3A illustrates an embodiment where first clock signal generator 110 of FIG. 1 is a DLL.

Referring to FIGS. 1 and 3A, first clock signal generator 110 comprises a phase detector 310, a delay controller 320, and a delay unit 330. Phase detector 310 detects a phase difference by comparing reference clock signal CLK_REF with first clock signal CLK_1. Delay controller 320 outputs a control signal CON to control delay unit 330 in response to an output signal of phase detector 310. Delay unit 330 outputs first clock signal CLK_1 obtained by delaying reference clock signal CLK_REF by a predetermined time in response to control signal CON. Delay unit 330 comprises a plurality of delay ends (not shown), where each delay end comprises an inverter or s flip-flop.

First clock signal generator 110 is not required to have the configuration shown in FIG. 3A and can have another configuration as long as first clock signal CLK_1 is properly generated for normal operation of first data converter 120.

Figure 3B:
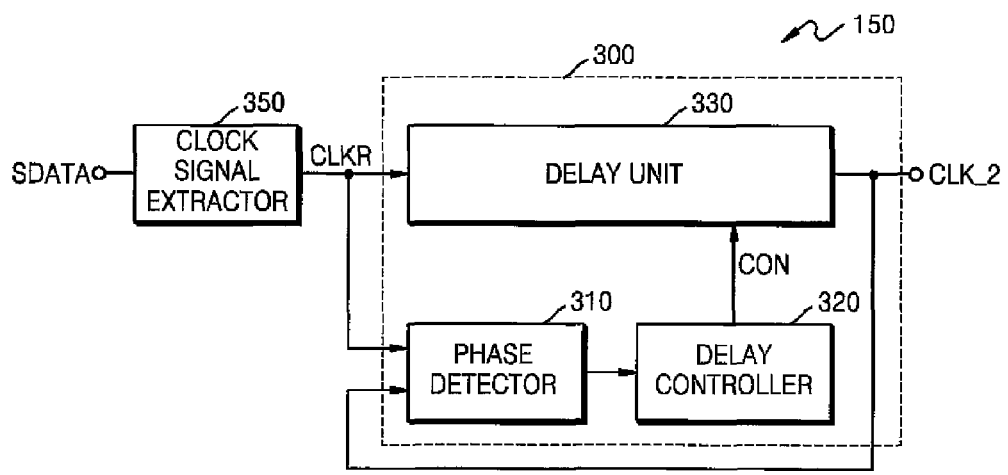
FIG. 3B is a block diagram of the second clock signal generator of FIG. 1 according to another embodiment of the inventive concept.

FIG. 3B is a block diagram of second clock signal generator 150 of FIG. 1 according to another embodiment of the inventive concept. In particular, FIG. 3B illustrates an embodiment where second clock signal generator 150 of FIG. 1 comprises a DLL. Second clock signal generator 150 comprises a clock signal extractor 350 and a DLL 300.

Referring to FIGS. 1 and 3B, clock signal extractor 350 extracts a clock signal CLKR from serial data SDATA. For example, where serial data SDATA comprises a dummy bit containing the clock information, clock signal extractor 350 extracts clock signal CLKR using the dummy bit. Alternatively, where the clock information is not included in the dummy bit, but in serial data SDATA, clock signal extractor 350 extracts clock signal CLKR using serial data SDATA.

DLL 300 comprises phase detector 310, delay controller 320, and delay unit 330. Phase detector 310 detects a phase difference by comparing clock signal CLKR with second clock signal CLK_2. Delay controller 320 outputs a control signal CON to control delay unit 330 in response to an output signal of phase detector 310. Delay unit 330 outputs second clock signal CLK_2 obtained by delaying clock signal CLKR by a predetermined time, in response to control signal CON. Delay unit 330 comprises a plurality of delay ends (not shown), where each delay end comprises an inverter or s flip-flop.

Second clock signal generator 150 is not required to have the configuration of FIG. 3B and can have another configuration as long as second clock signal CLK_2 is properly generated for normal operation of second data converter 160.

Figure 4:
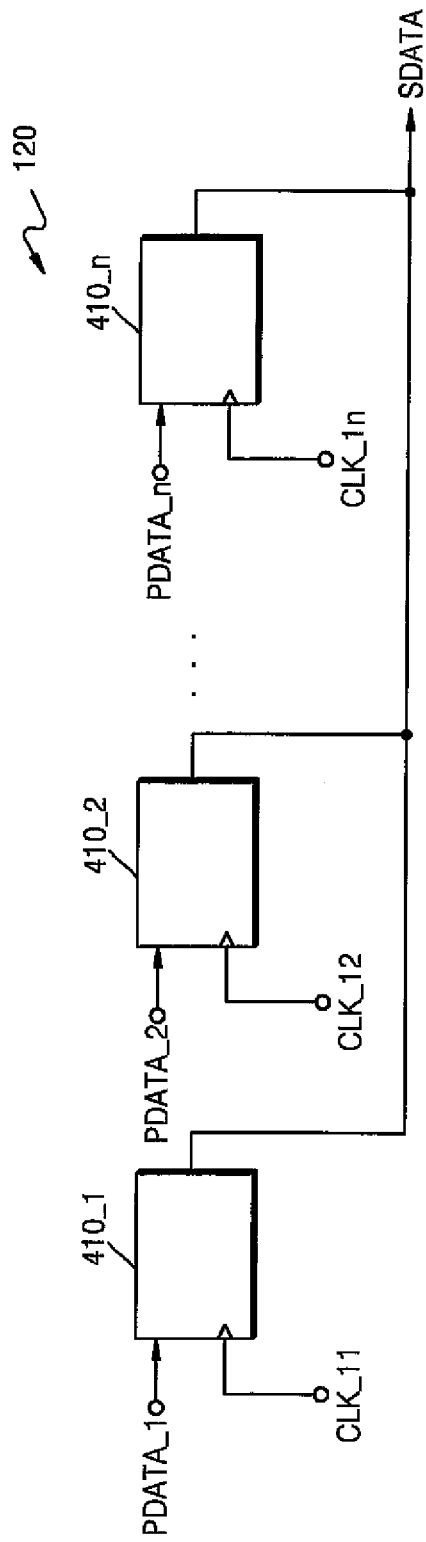
FIG. 4 is a block diagram of a first data converter of FIG. 1 according to an embodiment of the inventive concept.

FIG. 4 is a block diagram of first data converter 120 of FIG. 1 according to an embodiment of the inventive concept.

Referring to FIGS. 1 and 4, first data converter 120 comprises a plurality of flip-flops 410_1, 410_2, . . . , 410_$n$. Where first through n-th data components PDATA_1, PDATA_2, . . . , PDATA_n are input to first data converter 120 in parallel, first through n-th flip-flops 410_1, 410_2, . . . , 410_$n$ delay input data in response to respective clock signals CLK_11, CLK_12, . . . , CLK_1$n$ of first clock signal CLK_1. As an example, assume that first clock signals CLK_11, CLK_12, . . . , CLK_1$n$ are sequentially enabled in successive intervals. In this example, first data PDATA_1 is output via the first flip-flop 410_1 during an initial interval, second data PDATA_2 is output via the second flip-flop 410_2 during a next interval, and so on. Where one bit of each data component is output in each interval, first bits of the first through n-th data PDATA_1, PDATA_2, . . . , PDATA_n are sequentially included in serial data SDATA, and then second bits of the first through n-th data PDATA_1, PDATA_2, . . . , PDATA_n are sequentially included in serial data SDATA. An example of the operation of first data converter 120 will be described in further detail with reference to FIGS. 6 through 12C.

Figure 5:
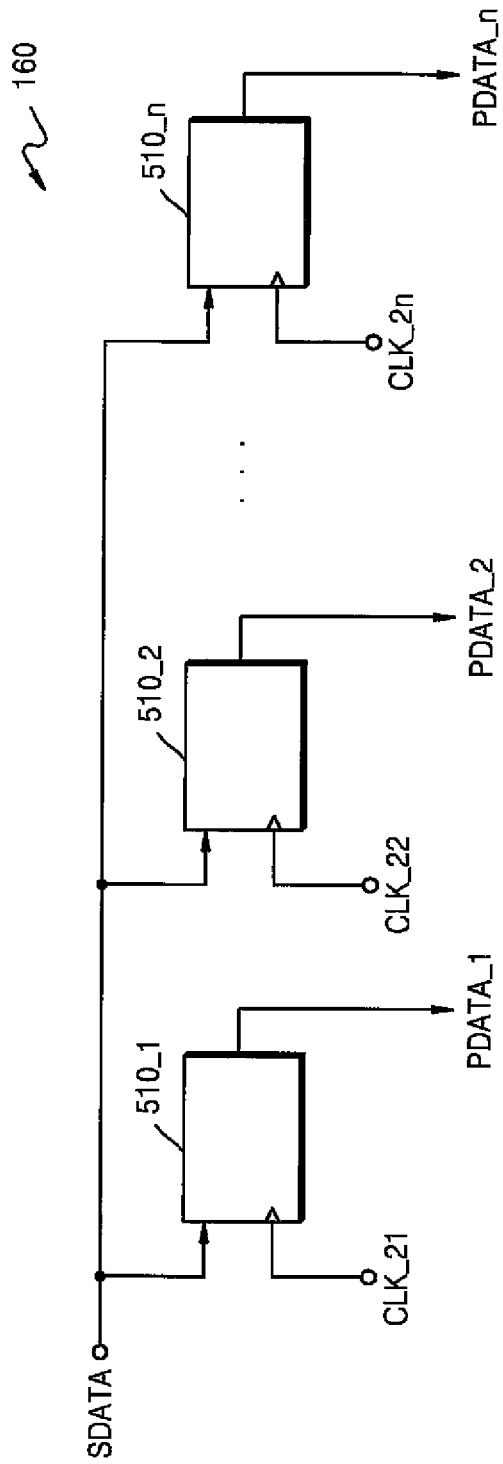
FIG. 5 is a block diagram of a second data converter of FIG. 1 according to an embodiment of the inventive concept.

FIG. 5 is a block diagram of second data converter 160 of FIG. 1 according to an embodiment of the inventive concept.

Referring to FIGS. 1 and 5, second data converter 160 comprises a plurality of flip-flops 510_1, 510_2, . . . , 510_$n$. Where serial data SDATA output from first data converter 120 is input to second data converter 160, first through n-th flip-flops 510_1, 510_2, . . . , 510_$n$ delay the input data in response to respective clock signals CLK_21, CLK_22, . . . , CLK_2$n$ of second clock signal CLK_2. As an example, assume that second clock signals CLK_21, CLK_22, . . . , CLK_2$n$ are sequentially enabled in successive intervals. In this example, serial data SDATA is output via first flip-flop 510_1 during an initial interval, and then output via second flip-flop 510_2 during a next interval, and so on.

Where one bit of each data component is output in each interval as in FIG. 4, first through n-th flip-flops 510_1, 510_2, . . . , 510_$n$ output first bits of the first through n-th data PDATA_1, PDATA_2, . . . , PDATA_n and then second bits of the first through n-th data PDATA_1, PDATA_2, . . . , PDATA_n in a sequential manner. An example of the operation of second data converter 160 will be described in further detail with reference to FIGS. 6 through 12C.

Figure 6:
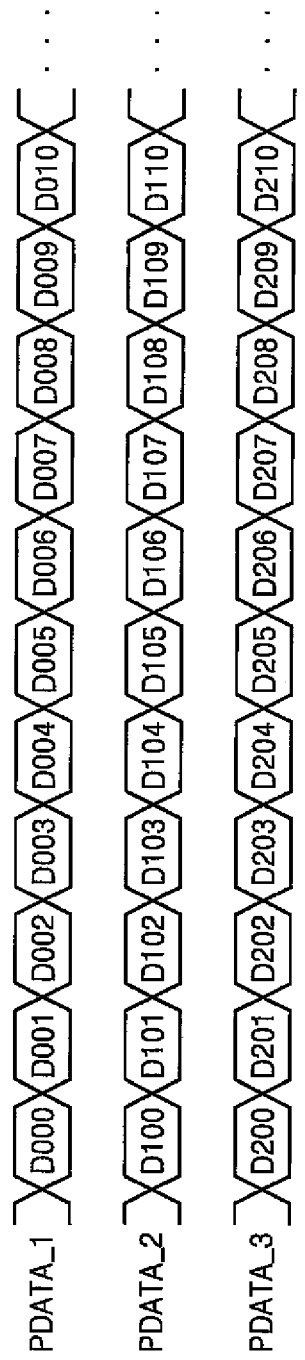
FIG. 6 is a waveform diagram illustrating an example data pattern that can be processed by the transceiver of FIG. 1.

FIG. 6 is a waveform diagram illustrating examples of data components PDATA_1, PDATA_2, . . . , PDATA_n of FIG. 1.

For convenience of explanation, three data components PDATA_1, PDATA_2, and PDATA_3 will be described with reference to FIG. 6. However, embodiments of the inventive concept are not limited to three data components, and methods similar to those described below can be used to process more than three data components.

Referring to FIGS. 1 and 6, first through third data components PDATA_1, PDATA_2, and PDATA_3 comprise a plurality of bits D000 through D010, D100 through D110, and D200 through D210, respectively. Although FIG. 6 illustrates an example where first through third data components PDATA_1, PDATA_2, and PDATA_3 comprise 11 bits D000 through D010, D100 through D110, and D200 through D210, respectively, embodiments of the inventive concept are not limited to this example, and each data component can comprise a different number of bits.

Figure 7:
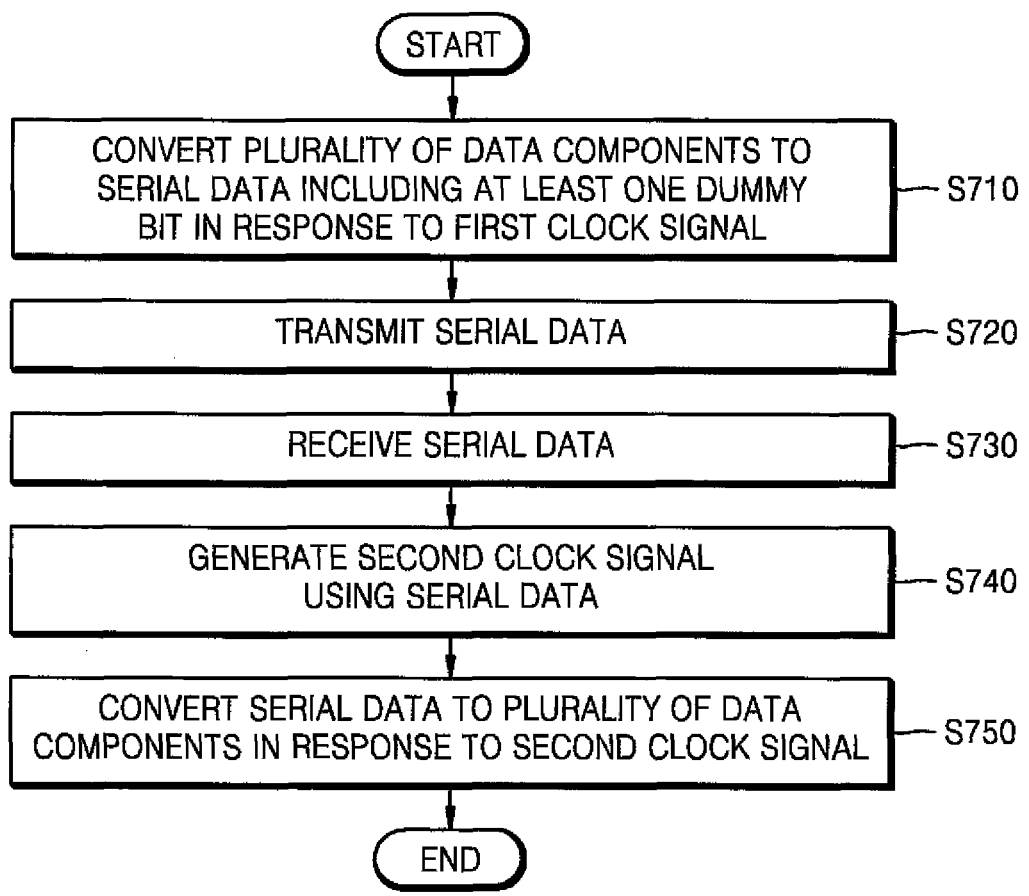
FIG. 7 is a flowchart illustrating a method of operating a transceiver using embedded clock signals according to an embodiment of the inventive concept.

FIG. 7 is a flowchart illustrating a method of operating a transceiver using embedded clock signals according to an embodiment of the inventive concept. In the description that follows, example method steps are indicated by parentheses (SXXX).

Referring to FIGS. 1 through 7, first data converter 120 converts data components PDATA_1, PDATA_2, . . . , PDATA_n into serial data SDATA comprising at least one dummy bit in response to first clock signal CLK_1 generated by first clock signal generator 110 (S710). The at least one dummy bit comprises information regarding a type of data components PDATA_1, PDATA_2, . . . , PDATA_n input to first data converter 120. Alternatively, the at least one dummy bit comprises information regarding the type of data components PDATA_1, PDATA_2, . . . , PDATA_n and also clock information.

Transmitter TX transmits serial data SDATA to receiver RX (S720), and receiver RX receives serial data SDATA from transmitter TX (S730). Second clock signal generator 150 generates second clock signal CLK_2 using serial data SDATA (S740). Second data converter 160 receives second clock signal CLK_2 and serial data SDATA and converts serial data SDATA to data components PDATA_1, PDATA_2, . . . , PDATA_n in response to second clock signal CLK_2 (S750).

The operation of first data converter 120 and second data converter 160 during the method of FIG. 7 will be described in further detail with reference to FIGS. 8A through 8C.

Figure 8A:
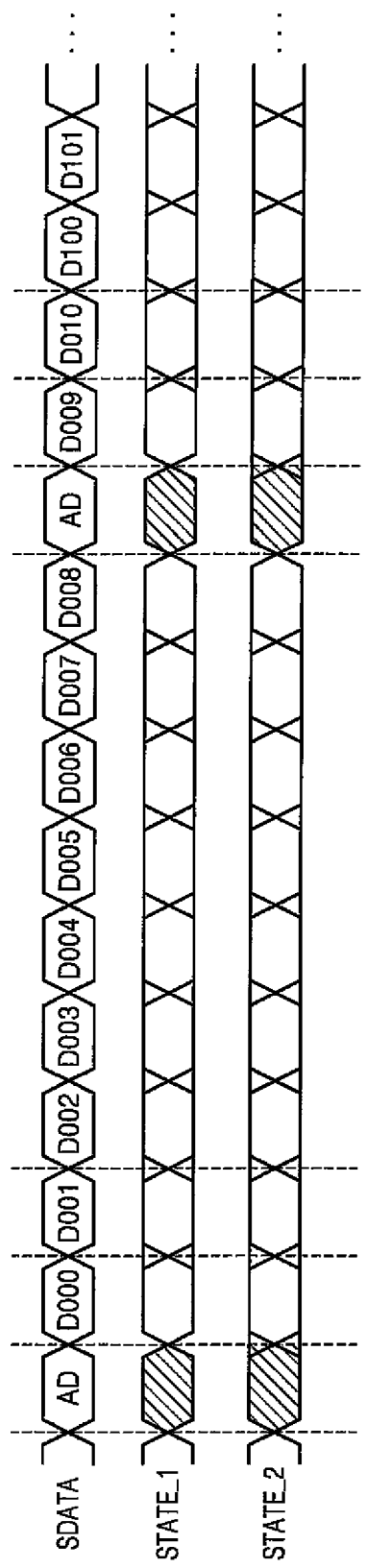
FIGS. 8A to 8C are waveform diagrams of serial data generated by the method of FIG. 7.
Figure 8B:
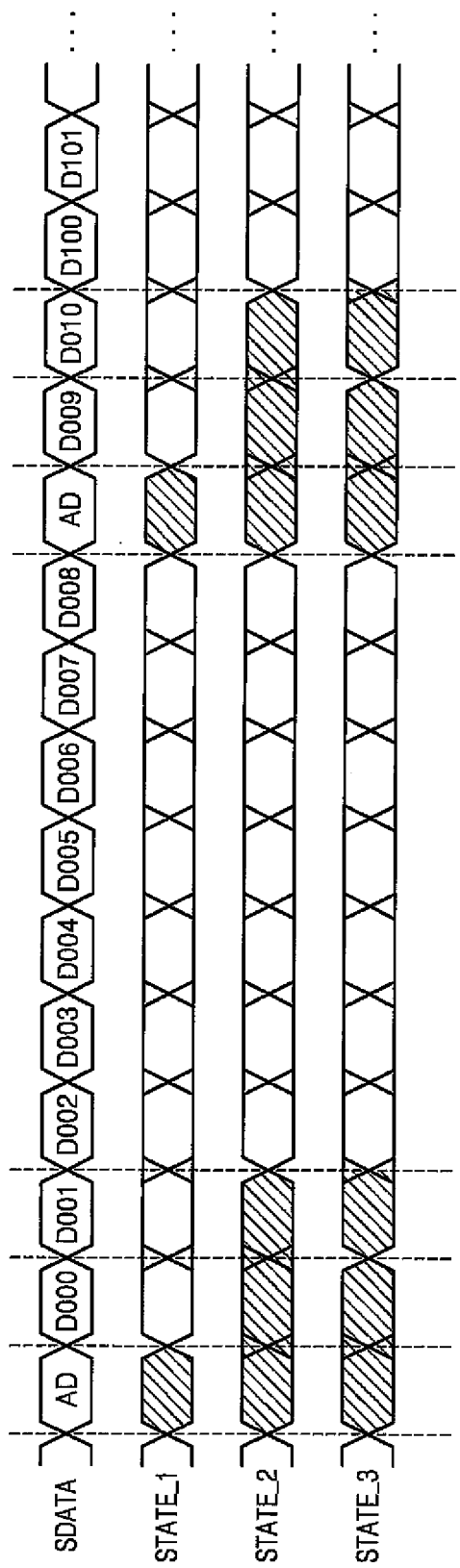
Figure 8C:
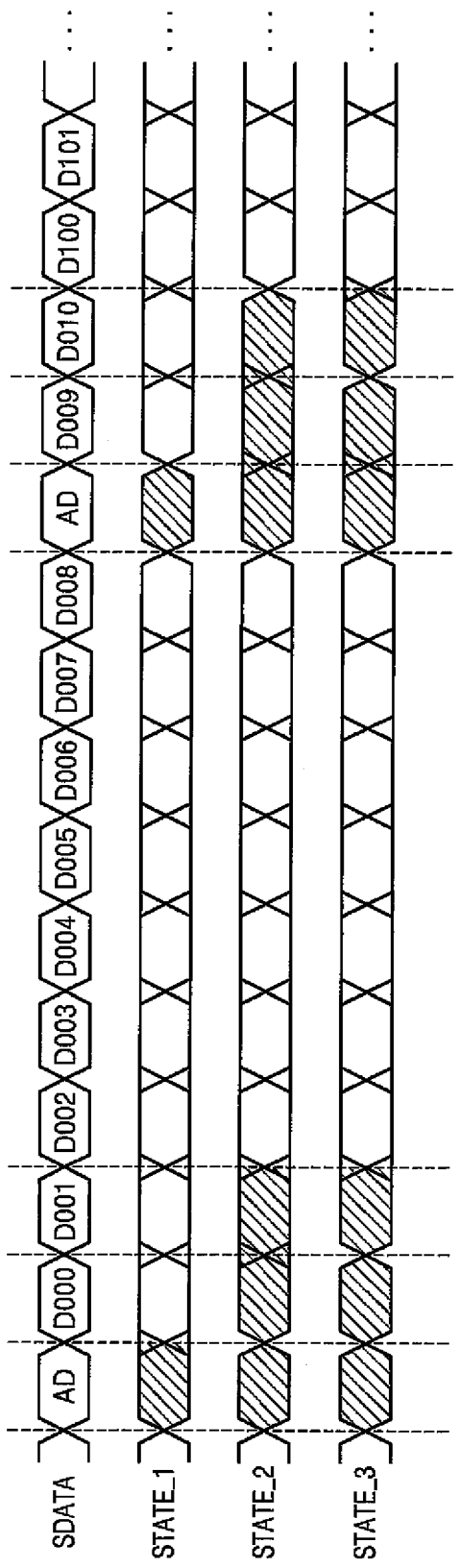

FIGS. 8A through 8C are waveform diagrams of serial data SDATA produced by the method of FIG. 7.

Referring to FIGS. 1 through 8C, in step S710 of FIG. 7, first data converter 120 generates serial data SDATA in the form of FIG. 8A, 8B, or 8C. Although FIGS. 8A through 8C illustrate examples where 9 data bits D000, D001, . . . , D008 are included between dummy bits AD, embodiments of the inventive concept are not limited to these examples, and different numbers of data bits can be included between dummy bits AD. In addition, data bits D000, D001, . . . , D008 between dummy bits AD do not have to be interleaved in the order shown in FIGS. 8A through 8C, and data bits D000, D001, . . . , D008 could be interleaved in various alternative orders.

In FIGS. 8A through 8C, logical states of a group of bits including dummy bit AD can be determined according to a type of data components PDATA_1, PDATA_2, . . . , PDATA_n. In addition, in FIGS. 8A through 8C, a type of data components PDATA_1, PDATA_2, . . . , PDATA_n can be determined by comparing logical states of a group of bits including dummy bit AD to each other.

In the example of FIG. 8A, first data converter 120 determines logical states of two bits including dummy bit AD (e.g., dummy bit AD and first bit D000 adjacent to dummy bit AD) according to a type of data components PDATA_1, PDATA_2, . . . , PDATA_n. Where data components PDATA_1, PDATA_2, . . . , PDATA_n are in a first state STATE_1, first data converter 120 determines a logical state of dummy bit AD so that dummy bit AD has a different logical state from first bit D000 adjacent to dummy bit AD. Alternatively, where data components PDATA_1, PDATA_2, . . . , PDATA_n are in a second state STATE_2, first data converter 120 determines a logical state of dummy bit AD so that dummy bit AD has the same logical state as first bit D000 adjacent to dummy bit AD.

In some embodiments, first state STATE_1 indicates that data components PDATA_1, PDATA_2, . . . , PDATA_n comprise payload information, and second state STATE_2 indicates that data components PDATA_1, PDATA_2, . . . , PDATA_n do not comprise payload information. In some alternative embodiments, first state STATE_1 indicates that data components PDATA_1, PDATA_2, . . . , PDATA_n do not comprise payload information, and second state STATE_2 indicates that data components PDATA_1, PDATA_2, . . . , PDATA_n comprise payload information.

Data components comprising payload information can be, for instance, data to be recorded in a memory cell of a memory device, or display information for a display device. Data components that do not comprise payload information can be, for instance, additional information needed to normally operate the memory device or the display device. However, embodiments of the inventive concept are not limited to the classification payload information and non-payload information as described above. Rather, various alternative types of information can be defined and transmitted in a similar manner.

Second data converter 160 determines a type of serial data SDATA by comparing logical states of two bits including dummy bit AD (e.g., dummy bit AD and first bit D000 adjacent to dummy bit AD) to each other. Where dummy bit AD and first bit D000 adjacent to dummy bit AD have different logical states, second data converter 160 determines that serial data SDATA is in first state STATE_1. On the other hand, where dummy bit AD and first bit D000 adjacent to dummy bit AD have the same logical state, second data converter 160 determines that serial data SDATA is in second state STATE_2.

In the example of FIG. 8B, logical states of three bits including dummy bit AD (e.g., dummy bit AD, first bit D000 adjacent to dummy bit AD, and second bit D001 adjacent to first bit D000) are determined according to a type of data components PDATA_1, PDATA_2, . . . , PDATA_n. For example, where data components PDATA_1, PDATA_2, . . . , PDATA_n are in first state STATE_1, first data converter 120 determines a logical state of dummy bit AD so that dummy bit AD has a different logical state from first bit D000 adjacent to dummy bit AD. Where data components PDATA_1, PDATA_2, . . . , PDATA_n are in second state STATE_2, first data converter 120 determines that dummy bit AD has the same logical state as first bit D000 adjacent to dummy bit AD and first bit D000 has the same logical state as second bit D001 adjacent to first bit D000. Finally, where data components PDATA_1, PDATA_2, . . . , PDATA_n are in a third state STATE_3, first data converter 120 determines that dummy bit AD has the same logical state as first bit D000 adjacent to dummy bit AD and first bit D000 and second bit D001 adjacent to first bit D000 have different logical states. The first through third states STATE_1, STATE_2, and STATE_3 can be variously defined as needed to classify types of data components PDATA_1, PDATA_2, . . . , PDATA_n.

Second data converter 160 determines a type of serial data SDATA by comparing logical states of three bits including dummy bit AD (e.g., dummy bit AD, first bit D000 adjacent to dummy bit AD, and second bit D001 adjacent to first bit D000) to each other. Where dummy bit AD and first bit D000 adjacent to dummy bit AD have different logical states, second data converter 160 determines that serial data SDATA is in first state STATE_1. Where dummy bit AD and first bit D000 adjacent to dummy bit AD have the same logical state, and where first bit D000 and second bit D001 adjacent to first bit D000 have the same logical state, second data converter 160 determines that serial data SDATA is in second state STATE_2. Finally, where dummy bit AD and first bit D000 adjacent to dummy bit AD have the same logical state, and where first bit D000 and second bit D001 adjacent to first bit D000 have different logical states, second data converter 160 determines that serial data SDATA is in third state STATE_3.

Similar to the example of FIG. 8B, in FIG. 8C, logical states of three bits including dummy bit AD (e.g., dummy bit AD, first bit D000 adjacent to dummy bit AD, and second bit D001 adjacent to first bit D000) are determined according to a type of data components PDATA_1, PDATA_2, . . . , PDATA_n. For example, where data components PDATA_1, PDATA_2, . . . , PDATA_n are in first state STATE_1, first data converter 120 determines a logical state of dummy bit AD so that dummy bit AD has the same logical state as first bit D000 adjacent to dummy bit AD. Where data components PDATA_1, PDATA_2, . . . , PDATA_n are in second state STATE_2, first data converter 120 determines that dummy bit AD and first bit D000 adjacent to dummy bit AD have different logical states and first bit D000 and second bit D001 adjacent to first bit D000 have the same logical state. Finally, where data components PDATA_1, PDATA_2, . . . , PDATA_n are in third state STATE_3, first data converter 120 determines that dummy bit AD and first bit D000 adjacent to dummy bit AD have different logical states and first bit D000 and second bit D001 adjacent to first bit D000 have different logical states. First through third states STATE_1, STATE_2, and STATE_3 can be variously defined as needed to classify types of data components PDATA_1, PDATA_2, . . . , PDATA_n to be transmitted.

Second data converter 160 determines a type of serial data SDATA by comparing logical states of three bits including dummy bit AD (e.g., dummy bit AD, first bit D000 adjacent to dummy bit AD, and second bit D001 adjacent to first bit D000) to each other. When dummy bit AD and first bit D000 adjacent to dummy bit AD have the same logical state, second data converter 160 may determine that serial data SDATA is in first state STATE_1. In addition, where dummy bit AD and first bit D000 adjacent to dummy bit AD have different logical states, and where first bit D000 and second bit D001 adjacent to first bit D000 have the same logical state, second data converter 160 determines that serial data SDATA is in second state STATE_2. Finally, where dummy bit AD and first bit D000 adjacent to dummy bit AD have different logical states, and where first bit D000 and second bit D001 adjacent to first bit D000 have different logical states, second data converter 160 determines that serial data SDATA is in third state STATE_3.

Figure 9:
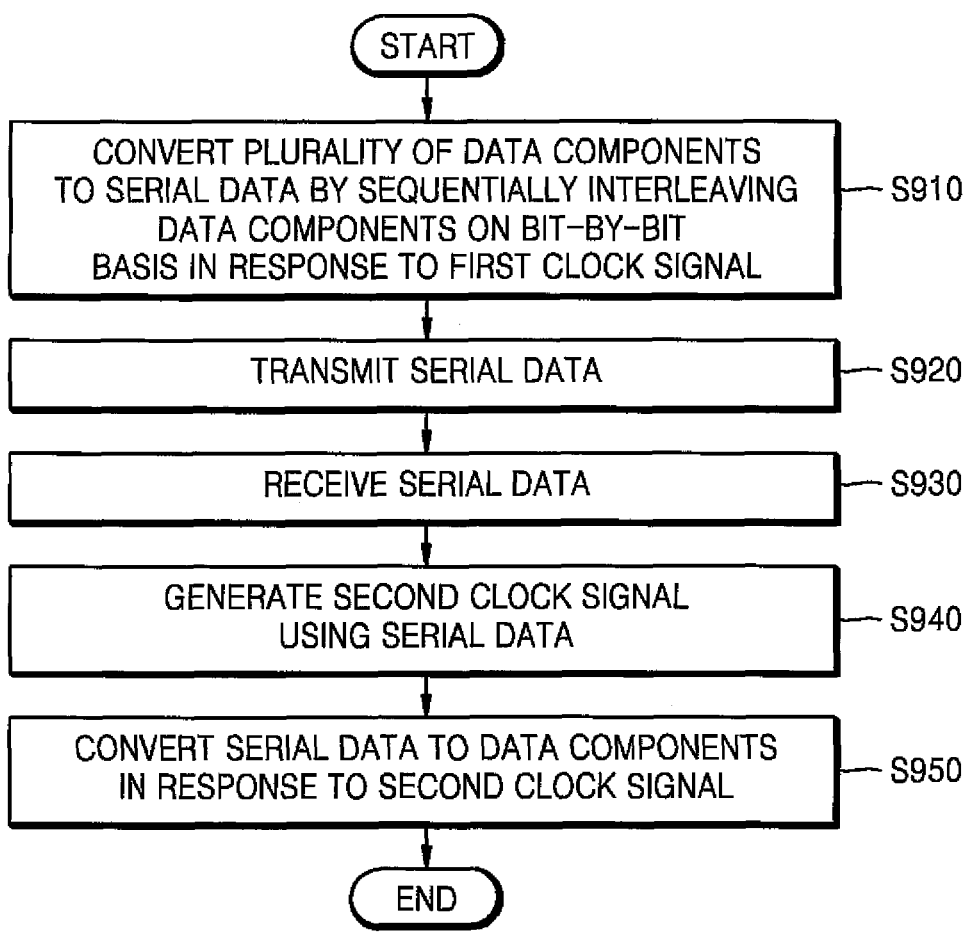
FIG. 9 is a flowchart illustrating a method of operating a transceiver using embedded clock signals according to another embodiment of the inventive concept.

FIG. 9 is a flowchart illustrating a method of operating a transceiver using embedded clock signals according to another embodiment of the inventive concept.

Referring to FIGS. 1 through 6 and 9, first data converter 120 converts data components PDATA_1, PDATA_2, . . . , PDATA_n to serial data SDATA by sequentially interleaving data components PDATA_1, PDATA_2, . . . , PDATA_n on a bit-by-bit basis in response to first clock signal CLK_1 generated by first clock signal generator 110 (S910). Transmitter TX transmits serial data SDATA to receiver RX (S920), and receiver RX receives serial data SDATA from transmitter TX (S930). Second clock signal generator 150 generates second clock signal CLK_2 using serial data SDATA (S940). Second data converter 160 receives second clock signal CLK_2 and serial data SDATA and converts serial data SDATA into data components PDATA_1, PDATA_2, ..., PDATA_n in response to second clock signal CLK_2 (S950).

The operation of first data converter 120 and second data converter 160 during the method of FIG. 9 will be described in further detail with reference to FIGS. 10A through 10C.

Figure 10A:
FIGS. 10A to 10C are waveform diagrams of serial data generated by the method of FIG. 9.
Figure 10B:
Figure 10C:

FIGS. 10A through 10C are waveform diagrams of serial data SDATA generated by the method of FIG. 9.

Referring to FIGS. 1 through 6 and 9 through 10C, in step S910 of FIG. 9, first data converter 120 generates serial data SDATA in the form shown in FIG. 10A, 10B, or 10C. For convenience of explanation, it will be assumed that first through third data components PDATA_1, PDATA_2, and PDATA_3 are input to first data converter 120, which converts first to third data PDATA_1, PDATA_2, and PDATA_3 into serial data SDATA. However, embodiments of the inventive concept are not limited to this example.

In the example of FIG. 10A, first data converter 120 generates serial data SDATA by sequentially interleaving one bit of first data PDATA_1, one bit of second data PDATA_2, and one bit of third data PDATA_3. Thus, serial data SDATA is generated in the order of first bit D000 of first data PDATA_1, first bit D100 of second data PDATA_2, first bit D200 of third data PDATA_3, second bit D001 of first data PDATA_1, second bit D101 of second data PDATA_2, second bit D201 of third data PDATA_3, and so on.

In the example of FIG. 10B, first data converter 120 generates serial data SDATA by sequentially interleaving one bit of first data PDATA_1, one bit of third data PDATA_3, and one bit of second data PDATA_2. Thus, serial data SDATA is generated in the order of first bit D000 of first data PDATA_1, first bit D200 of third data PDATA_3, first bit D100 of second data PDATA_2, second bit D001 of first data PDATA_1, second bit D201 of third data PDATA_3, second bit D101 of second data PDATA_2, and so on.

In the example of FIG. 10C, first data converter 120 generates serial data SDATA by sequentially interleaving one bit of second data PDATA_2, one bit of first data PDATA_1, and one bit of third data PDATA_3. Thus, serial data SDATA is generated in the order of first bit D100 of second data PDATA_2, first bit D000 of first data PDATA_1, first bit D200 of third data PDATA_3, second bit D101 of second data PDATA_2, second bit D001 of first data PDATA_1, second bit D201 of third data PDATA_3, and so on.

FIGS. 10A through 10C illustrate examples of serial data SDATA generated in step S910 of FIG. 9. However, embodiments of the inventive concept are not limited to these examples, and serial data SDATA can be generated in other forms where data components are sequentially interleaved.

Figure 11:
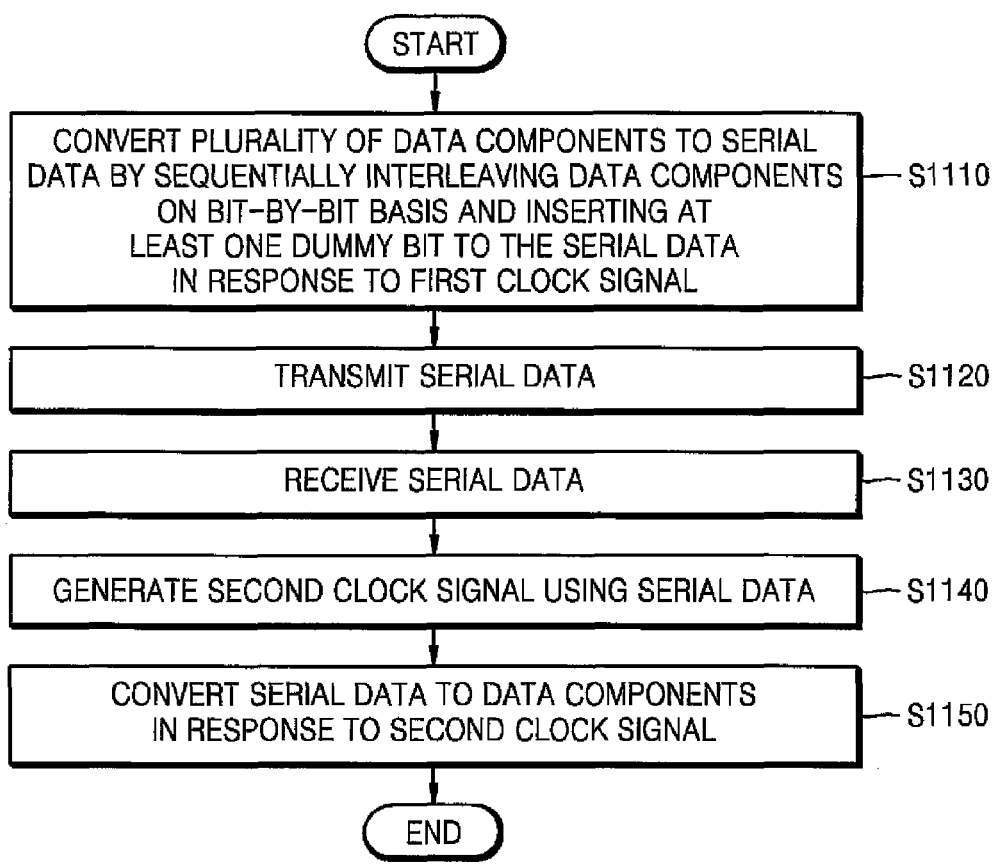
FIG. 11 is a flowchart illustrating a method of operating a transceiver using embedded clock signals according to another embodiment of the inventive concept.

FIG. 11 is a flowchart illustrating a method of operating a transceiver using embedded clock signals according to another embodiment of the inventive concept.

Referring to FIGS. 1 through 11, first data converter 120 converts data components PDATA_1, PDATA_2, ..., PDATA_n into serial data SDATA by sequentially interleaving data components PDATA_1, PDATA_2, ..., PDATA_n on a bit-by-bit basis and inserting at least one dummy bit in response to first clock signal CLK_1 generated by first clock signal generator 110 (S1110). Step S1110 combines step S710 of FIG. 7 and step S910 of FIG. 9. The at least one dummy bit typically comprises information regarding a type of data components PDATA_1, PDATA_2, ..., PDATA_n input to first data converter 120 as described in FIG. 7. Alternatively, the at least one dummy bit can comprise information regarding the type of data components PDATA_1, PDATA_2, ..., PDATA_n and the clock information. Transmitter TX transmits serial data SDATA to receiver RX (S1120), and receiver RX receives serial data SDATA from transmitter TX (S1130). Second clock signal generator 150 generates second clock signal CLK_2 using serial data SDATA (S1140). Second data converter 160 receives second clock signal CLK_2 and serial data SDATA and converts serial data SDATA into data components PDATA_1, PDATA_2, ..., PDATA_n in response to second clock signal CLK_2 (S1150).

The operation of first data converter 120 and second data converter 160 during the method of FIG. 11 will be described in further detail with reference to FIGS. 12A through 12C.

Figure 12A:
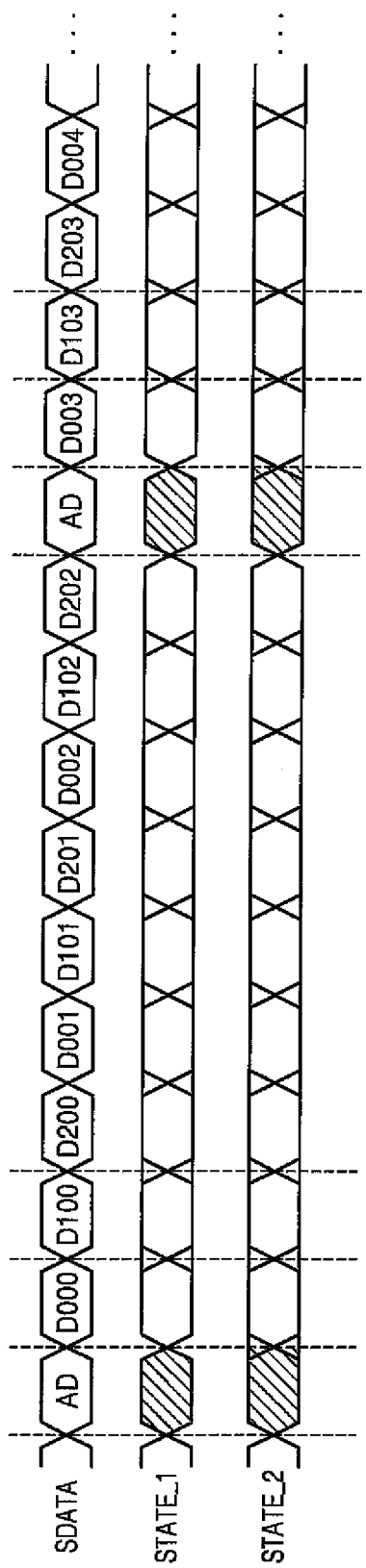
FIGS. 12A to 12C are waveform diagrams of serial data generated by the method of FIG. 11.
Figure 12B:
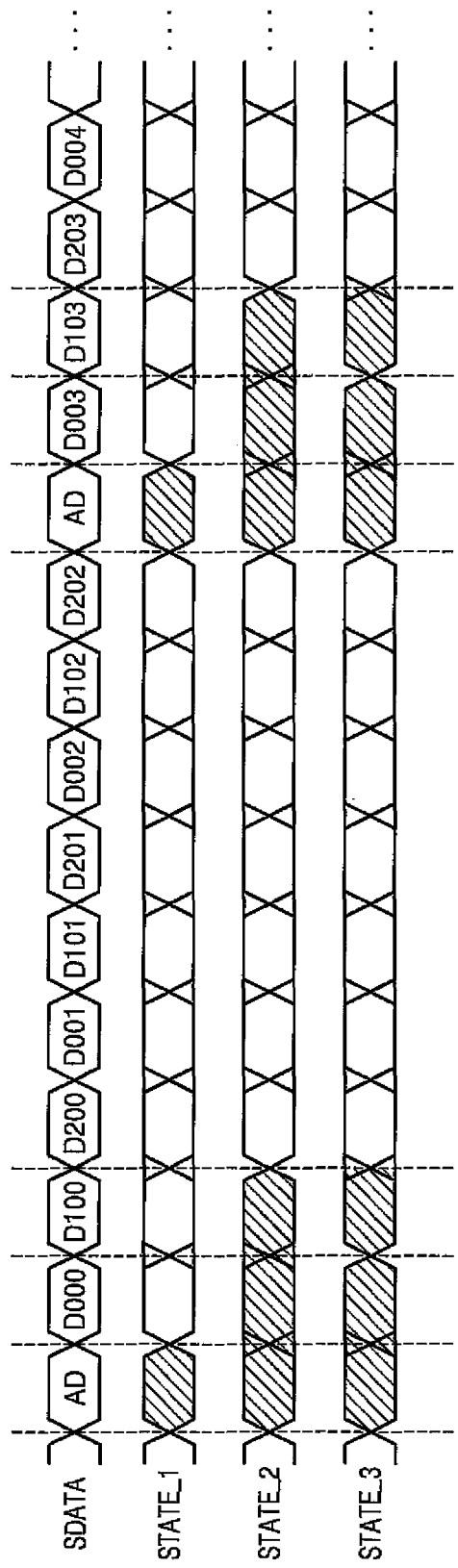
Figure 12C:
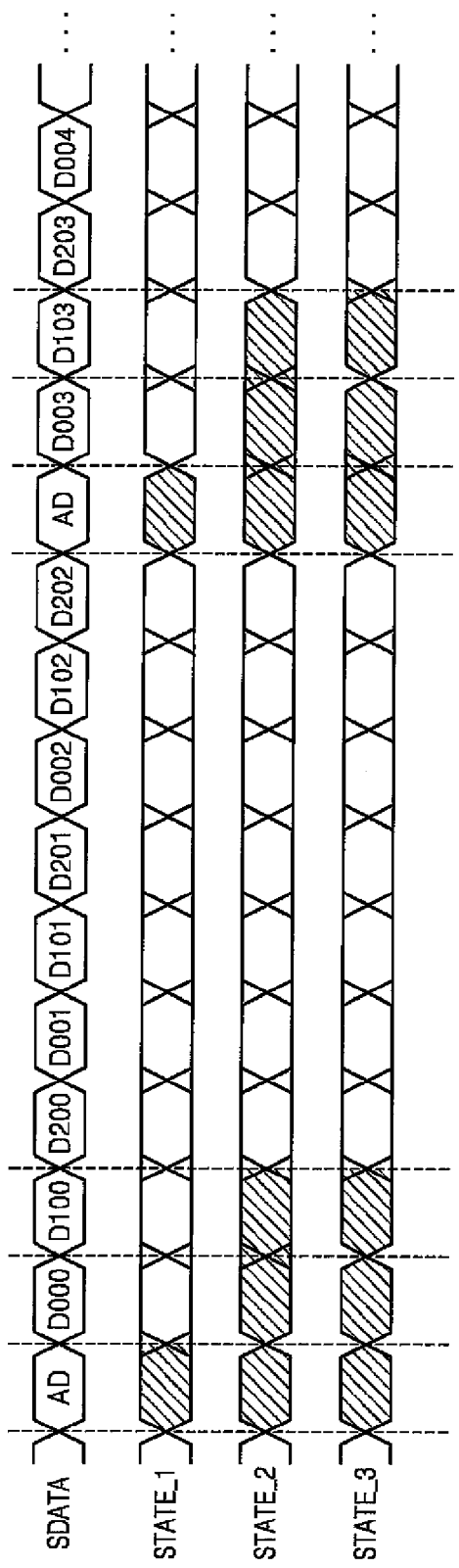

FIGS. 12A to 12C are waveform diagrams of serial data SDATA generated by the method of FIG. 11.

Bits of serial data SDATA of FIGS. 12A through 12C are interleaved in the same order as serial data SDATA of FIG. 10A, and dummy bits are added between the interleaved bits at predetermined intervals. In addition, FIG. 12A illustrates that first data converter 120 of FIG. 1 determines a logical state of each dummy bit AD according to a type of data to be transmitted, and second data converter 160 of FIG. 1 determines a type of received data according to the determined logical state of each dummy bit AD in the same manner as described in FIG. 8A. FIG. 12B illustrates that first data converter 120 of FIG. 1 determines a logical state of each dummy bit AD according to a type of data to be transmitted, and second data converter 160 of FIG. 1 determines a type of received data according to the determined logical state of each dummy bit AD in the same manner as described in FIG. 8B. FIG. 12C illustrates that first data converter 120 of FIG. 1 determines a logical state of each dummy bit AD according to a type of data to be transmitted, and second data converter 160 of FIG. 1 determines a type of received data according to the determined logical state of each dummy bit AD in the same manner as described in FIG. 8C.

In the example of FIG. 12A, first data converter 120 generates serial data SDATA by sequentially interleaving one bit of first data PDATA_1, one bit of second data PDATA_2, and one bit of third data PDATA_3. Thus, serial data SDATA is generated in the order of first bit D000 of first data PDATA_1, first bit D100 of second data PDATA_2, first bit D200 of third data PDATA_3, second bit D001 of first data PDATA_1, second bit D101 of second data PDATA_2, second bit D201 of third data PDATA_3, and so on.

In addition, first data converter 120 determines logical states of two bits including dummy bit AD (e.g., dummy bit AD, and first bit D000 adjacent to dummy bit AD) according to a type of data components PDATA_1, PDATA_2, ..., PDATA_n. Where data components PDATA_1, PDATA_2, ..., PDATA_n are in first state STATE_1, first data converter 120 determines a logical state of dummy bit AD so that dummy bit AD has a different logical state from first bit D000 adjacent to dummy bit AD. In addition, where data components PDATA_1, PDATA_2, ..., PDATA_n are in second state STATE_2, first data converter 120 determines a logical state of dummy bit AD so that dummy bit AD has the same logical state as first bit D000 adjacent to dummy bit AD.

The example of FIG. 12A combines various features of the example of FIG. 8A and the example of FIG. 10A, and so a detailed description of repeated features has been omitted to avoid redundancy.

Similar to the example of FIG. 12A, in the example of FIG. 12B, first data converter 120 generates serial data SDATA by sequentially interleaving one bit of first data PDATA_1, one bit of second data PDATA_2, and one bit of third data PDATA_3. In addition, logical states of three bits including dummy bit AD, i.e., dummy bit AD, first bit D000 adjacent to dummy bit AD, and second bit D001 adjacent to first bit D000, are determined according to a type of data components PDATA_1, PDATA_2, ..., PDATA_n. For example, where data components PDATA_1, PDATA_2, ..., PDATA_n are in first state STATE_1, first data converter 120 determines a logical state of dummy bit AD so that dummy bit AD has a different logical state from first bit D000 adjacent to dummy bit AD. In addition, where data components PDATA_1, PDATA_2, ..., PDATA_n are in second state STATE_2, first data converter 120 determines that dummy bit AD has the same logical state as first bit D000 adjacent to dummy bit AD and first bit D000 has the same logical state as second bit D001 adjacent to first bit D000. Finally, where data components PDATA_1, PDATA_2, ..., PDATA_n are in third state STATE_3, first data converter 120 determines that dummy bit AD has the same logical state as first bit D000 adjacent to dummy bit AD, and first bit D000 and second bit D001 adjacent to first bit D000 have different logical states. First through third states STATE_1, STATE_2, and STATE_3 can be variously defined as needed to classify types of data components PDATA_1, PDATA_2, ..., PDATA_n.

The example of FIG. 12B combines various features of the example of FIG. 8A and the example of FIG. 10B, and so a detailed description of repeated features has been omitted to avoid redundancy.

Similar to the examples of FIGS. 12A and 12B, in the example of FIG. 12C, first data converter 120 generates serial data SDATA by sequentially interleaving one bit of first data PDATA_1, one bit of second data PDATA_2, and one bit of third data PDATA_3. In addition, similar to the example of FIG. 12B, logical states of three bits including dummy bit AD, i.e., dummy bit AD, first bit D000 adjacent to dummy bit AD, and second bit D001 adjacent to first bit D000, are determined according to a type of data components PDATA_1, PDATA_2, ..., PDATA_n. For example, where data components PDATA_1, PDATA_2, ..., PDATA_n are in first state STATE_1, first data converter 120 determines a logical state of dummy bit AD so that dummy bit AD has the same logical state as first bit D000 adjacent to dummy bit AD. In addition, where data components PDATA_1, PDATA_2, ..., PDATA_n are in second state STATE_2, first data converter 120 determines that dummy bit AD and first bit D000 adjacent to dummy bit AD have different logical states and first bit D000 and second bit D001 adjacent to first bit D000 have the same logical state. Finally, where data components PDATA_1, PDATA_2, ..., PDATA_n are in third state STATE_3, first data converter 120 determines that dummy bit AD and first bit D000 adjacent to dummy bit AD have different logical states and first bit D000 and second bit D001 adjacent to first bit D000 have different logical states. First through third states STATE_1, STATE_2, and STATE_3 can be variously defined as needed to classify types of data components PDATA_1, PDATA_2, ..., PDATA_n to be transmitted.

The example of FIG. 12C combines various features of the example of FIG. 8A and the example of FIG. 10C, and so a detailed description of repeated features has been omitted for conciseness.

FIGS. 12A through 12C have been described with reference to serial data SDATA shown in FIG. 10A. However, embodiments of the inventive concept are not limited to these examples, and can be modified in a variety of ways, such as those illustrated in FIGS. 9 through 10C, where serial data SDATA has a different ordering.

Figure 13:
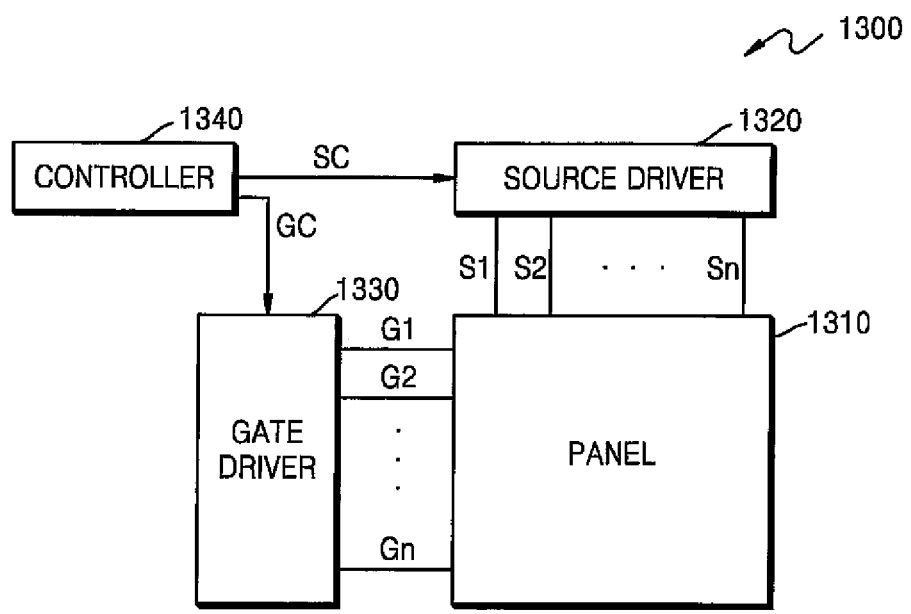
FIG. 13 is a block diagram of a display device according to an embodiment of the inventive concept.

FIG. 13 is a block diagram of a display device 1300 according to an embodiment of the inventive concept.

Referring to FIG. 13, display device 1300 comprises a panel 1310, a source driver 1320, a gate driver 1330, and a controller 1340. Panel 1310 comprises a plurality of pixel areas. A plurality of gate lines G1 through Gn and source lines S1 through Sn are disposed in the form of matrix on panel 1310, and intersection points of gate lines G1 through Gn and source lines S1 through Sn are defined as the plurality of pixel areas.

Controller 1340 controls source driver 1320 and gate driver 1330. Controller 1340 receives a plurality of control signals and data signals from an external system (not shown). Controller 1340 generates a gate control signal GC and a source control signal SC in response to the received control signals and data signals, outputs the gate control signal GC to gate driver 1330, and outputs the source control signal SC to source driver 1320. Controller 1340 converts a plurality received data components to serial data and transmits the serial data to source driver 1320 as described above. Controller 1340 can operate similar to transmitter TX of FIGS. 1 through 12C.

Gate driver 1330 provides a gate driving signal sequentially to gate lines G1 through Gn in response to gate control signal GC, and panel 1310 receives the gate driving signal via gate lines G1 through Gn. Source driver 1320 provides a predetermined gradation voltage to panel 1310 via source lines 51 through Sn in response to the source control signal SC every time gate lines GL are sequentially selected. Source driver 1320 converts the serial data received from controller 1340 to data components as described above. For example, controller 1340 may operate similarly to receiver RX described in FIGS. 1 through 12C.

Figure 14:
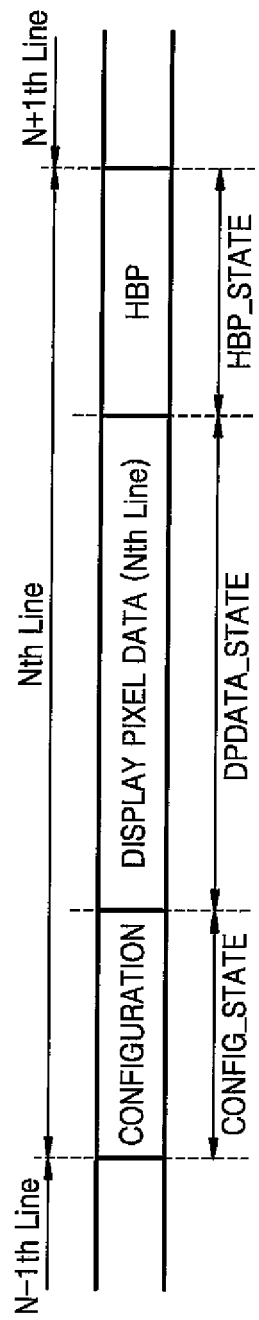
FIG. 14 is a state diagram of data used in the display device of FIG. 13.

FIG. 14 is a state diagram of data used in display device 1300 of FIG. 13.

Referring to FIGS. 1 through 14, the data used in display device 1300 can have various states. For example, in the example of FIG. 14, the data used in display device 1300 has a state CONFIG_STATE indicating that the data includes information regarding the operation of display device 1300, a state DPDATA_STATE indicating that the data includes display information, and a state HBP_STATE indicating that the data includes information for maintaining the display information for a predetermined duration. As examples, where it is necessary to transmit and receive data comprising only information on whether the data comprises the display information, the embodiment of FIG. 8A or 12A can be used. For instance, where data is transmitted and received with information regarding one or two of the three states in the data, the embodiment of FIG. 8A or 12A can be used. Similarly, where data is transmitted and received with information regarding the three states, the embodiment of FIG. 8B, 8C, 12B, or 12C can be used.

Although FIG. 14 illustrates an example where data used in display device 1300 has three states, embodiments of the inventive concept are not limited to this example, and information regarding other types of states or other numbers of states can be carried in the data.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of operating a transceiver, comprising:
    converting a plurality of data components into serial data in response to a first clock signal;
    transmitting and receiving the serial data;
    generating a second clock signal from the serial data; and
    converting the serial data into the plurality of data components in response to the second clock signal,
    wherein converting the plurality of data components into the serial data comprises adding at least one dummy bit to the serial data at predetermined intervals, the at least one dummy bit indicating a type of the plurality of data components;
    wherein converting the plurality of data components into the serial data comprises setting logical states of a predetermined number of bits of the serial data, including the dummy bit, according to the type of the plurality of data components, wherein converting the serial data into the plurality of data components comprises comparing a logical state of at least one of the predetermined number of bits, including the dummy bit, to a logical state of another one of the predetermined number of bits, and identifying the type of the plurality of data components based on the comparison, and wherein the dummy bit comprises clock information.

2. The method of claim 1, wherein converting the plurality of data components into the serial data comprises setting the at least one dummy bit to a logical state that is the same as or different from a logical state of a bit adjacent to the dummy bit, according to the type of the plurality of data components, and wherein converting the serial data into the plurality of data components comprises identifying the type of the plurality of data components by comparing the logical state of the bit adjacent to the dummy bit to the logical state of the dummy bit.

3. The method of claim 1, wherein converting the plurality of data components into the serial data comprises:
    where the plurality of data components include payload information, setting the at least one dummy bit to a different logical state from a bit adjacent to the at least one dummy bit;
    where the plurality of data components do not include the payload information, setting the at least one dummy bit to the same logical state as the bit adjacent to the dummy bit; and
    where the plurality of data components do not include the payload information, setting logical states of a predetermined number of bits, including the bit adjacent to the dummy bit, according to the type of the plurality of data components.

4. The method of claim 1, wherein converting of the plurality of data components into serial data comprises:
    where the data components comprise payload information, setting the dummy bit to a logical state that is the same as a logical state of a bit adjacent to the dummy bit;
    where the data components do not include the payload information, setting the dummy bit to a logical state that is different from the logical state of the bit adjacent to the dummy bit; and
    where the data components do not include the payload information, setting logical states of a predetermined number of bits, including the bit adjacent to the dummy bit, according to the type of the data components.

5. The method of claim 1, wherein converting the serial data into the plurality of data components comprises:
    where a logical state of the dummy bit is different from a logical state of a bit adjacent to the dummy bit, determining that the plurality of data components include payload information;
    where the logical state of the dummy bit is the same as the logical state of the bit adjacent to the dummy bit, determining that the plurality of data components do not include the payload information; and
    where the plurality of data components do not include the payload information, determining the type of the plurality of data components by comparing logical states of a predetermined number of bits, including the dummy bit, to each other.

6. The method of claim 1, wherein converting of the serial data into the data components comprises:
    where the dummy bit has a same logical state as a bit adjacent to the dummy bit, determining that the plurality of data components comprise payload information;
    where the dummy bit has a different logical state from the bit adjacent to the dummy bit, determining that the data components do not comprise payload information; and
    where the data components do not comprise the payload information, determining the type of the data components by comparing logical states of a predetermined number of bits, including the dummy bit, to each other.

7. The method of claim 1, further comprising generating the first clock signal from a reference clock signal using a delay locked loop or a phase locked loop.

8. The method of claim 1, wherein the plurality of data components are converted to the serial data by sequentially interleaving the plurality of data components on a bit-by-bit basis in response to the first clock signal.

9. A transceiver, comprising:
    a transmitter configured to convert a plurality of data components into serial data in response to a first clock signal and to transmit the serial data; and
    a receiver configured to receive the serial data and to convert the serial data into the plurality of data components in response to a second clock signal generated from the serial data,
    wherein the transmitter adds at least one dummy bit to the serial data at predetermined intervals, the at least one dummy bit including information regarding a type of the plurality of data components;
    wherein the transmitter generates the serial data by setting logical states of a predetermined number of bits of the serial data, including the dummy bit, according to the type of the plurality of data components, wherein the receiver identifies the type of the plurality of data components by comparing a logical state of at least one of the predetermined number of bits, including the dummy bit, to a logical state of another one of the predetermined number of bits, and determining the type of the plurality of data components based on the comparison, and wherein the dummy bit comprises clock information.

10. The transceiver of claim 9, wherein the transmitter sets the at least one dummy bit to have a same logical state or a different logic state from a bit adjacent to the dummy bit according to the type of the plurality of data components, and wherein the receiver identifies the type of the plurality of data components by comparing the logical state of the bit adjacent to the dummy bit to the logical state of the at least one dummy bit.

11. The transceiver of claim 9, wherein the transmitter sets a logical state of the dummy bit to a same logic state or a different logical state from a bit adjacent to the dummy bit according to whether the plurality of data components include payload information, and wherein the receiver determines that the plurality of data components include payload information according to whether the logical state of the dummy bit is the same or different from the logical state of the bit adjacent to the dummy bit.

12. The transceiver of claim 11, wherein, where the plurality of data components do not include payload information, the transmitter sets the at least one dummy bit to have the same logical state as the bit adjacent to the dummy bit, and sets logical states of a predetermined number of bits, including the bit adjacent to the dummy bit, according to the type of the plurality of data components, and wherein the receiver determines that the plurality of data components do not include the payload information by detecting that the at least one dummy bit has the same logical state as the bit adjacent to the dummy bit.

13. The transceiver of claim 9, wherein, where the plurality of data components include payload information, the transmitter sets the dummy bit with a same logical state as a bit adjacent to the dummy bit, and the receiver determines whether the plurality of data components include the payload information by detecting whether the logical state of the dummy bit is the same as the logical state of the bit adjacent to the dummy bit.

14. The transceiver of claim 13, wherein, where the plurality of data components do not include payload information, the transmitter sets the dummy bit to a logical state that is different from a logical state of a bit adjacent to the dummy bit and sets logical states of a predetermined number of bits, including the bit adjacent to the dummy bit, according to the type of the plurality of data components, and wherein, where the logical state of the dummy bit is different from the logical state of the bit adjacent to the dummy bit, the receiver determines that the plurality of data components do not include the payload information and identifies the type of the plurality of data components by comparing the logical states of the predetermined number of bits to each other.

15. The transceiver of claim 9, wherein the transmitter comprises a delay locked loop or a phase locked loop for generating the first clock signal based on a reference clock signal, and the receiver comprises a delay locked loop or a phase locked loop for generating the second clock signal based on the serial data.

16. The transceiver of claim 9, wherein the transmitter converts the plurality of data components into the serial data by sequentially interleaving the plurality of data components on a bit-by-bit basis in response to the first clock signal.

17. The transceiver of claim 9, wherein the plurality of data components comprise display information to be displayed on a display device.

18. The transceiver of claim 17, wherein the display device comprises a panel comprising a plurality of pixel areas, wherein the transmitter is part of a controller of the display device, and wherein the receiver is part of a source driver that drives source lines of the panel based on the plurality of data components.

* * * * *